(12) United States Patent
Miwa (10) Patent No.: US 9,525,066 B2
(45) Date of Patent: Dec. 20, 2016

(54) SEMICONDUCTOR DEVICE AND MANUFACTURING METHOD THEREOF

(71) Applicant: RENESAS ELECTRONICS CORPORATION, Kanagawa (JP)

(72) Inventor: Kiyotaka Miwa, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/749,416

(22) Filed: Jun. 24, 2015

(65) Prior Publication Data

US 2015/0380550 A1     Dec. 31, 2015

(30) Foreign Application Priority Data

Jun. 25, 2014    (JP) ................. 2014-130822

(51) Int. Cl.
| | |
|---|---|
| H01L 29/78 | (2006.01) |
| H01L 21/225 | (2006.01) |
| H01L 29/36 | (2006.01) |
| H01L 29/66 | (2006.01) |
| H01L 21/265 | (2006.01) |
| H01L 29/06 | (2006.01) |
| H01L 29/10 | (2006.01) |

(52) U.S. Cl.
CPC ....... *H01L 29/7836* (2013.01); *H01L 29/0653* (2013.01); *H01L 29/105* (2013.01); *H01L 29/1083* (2013.01); *H01L 29/665* (2013.01)

(58) Field of Classification Search
CPC ............. H01L 29/7836; H01L 29/0653; H01L 29/105; H01L 29/1083; H01L 29/665
See application file for complete search history.

(56) References Cited

U.S. PATENT DOCUMENTS

2009/0134477 A1*   5/2009   Kim .................. H01L 21/28035
                                                         257/408

FOREIGN PATENT DOCUMENTS

JP          2000-100964 A     4/2000

* cited by examiner

*Primary Examiner* — Whitney T Moore
(74) *Attorney, Agent, or Firm* — McDermott Will & Emery LLP (57) ABSTRACT

Provided is a technique for promoting miniaturization of a MISFET. A p-type well region is disposed between LDDs (n-type low-concentration regions) of a MISFET (Qn) to cause both the well region and the low-concentration region to partially overlap each other, whereby an overlap region formed of an n-type semiconductor region having a higher resistance than that of the n-type low-concentration region is provided between the p-type well region and each of the n-type low-concentration regions. In this way, the overlap region can relieve an electric field concentration at the end of the n-type low-concentration region, thereby suppressing the occurrence of hot carriers without elongating an offset length of the LDD, which can promote the miniaturization of the MISFET (Qn), particularly, that operates at high voltage.

4 Claims, 13 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2014-130822 filed on Jun. 25, 2014 including the specification, drawings and abstract is incorporated herein by reference in its entirety.

BACKGROUND

The present invention relates to semiconductor devices and manufacturing methods thereof, and more specifically, to a technique that can be suitably applied to a semiconductor device including a MISFET that operates at high voltage of, e.g. several tens of V, and a manufacturing method thereof.

Semiconductor devices are configured by forming a number of circuit elements, including a MOSFET, a resistor, and a capacitor, over a main surface of a semiconductor substrate formed of a monocrystalline silicon etc., and coupling the respective circuit elements so as to perform a required circuit operation and function.

In recent years, semiconductor devices have pursued the miniaturization of elements or the use of multiple power sources (increase of a voltage etc.) to meet the demands from market. However, together with the miniaturization of the elements, there arises a problem that the life of a gate oxide film in a MOS transistor is reduced due to hot carriers. This is mainly caused by impact ionization due to an electric field concentration at an end of a drain region.

For this reason, in the related art, some semiconductor devices employ a lightly doped drain (LDD) structure that includes a drain region comprised of a region with a low impurity concentration (low-concentration region) and another region with a high impurity concentration (high-concentration impurity region), thereby relieving the electric field concentration at the end of the drain region.

For example, Patent Document 1 (Japanese Unexamined Patent Application Publication No. 2000-100964) discloses a technique for a semiconductor device having a plurality of types of MOS transistors with different voltages applied. In the technique, a sidewall spacer length (length of a sidewall insulating film) is adjusted by changing the thickness of a gate electrode for each type of the MOS transistor, so that an offset length (distance from the end of the gate electrode to a high-concentration region) of the MOS transistor, which is intended to reduce hot carriers most, is set longer than that of each of other MOS transistors.

RELATED ART DOCUMENT

Patent Document

Patent Document 1

Japanese Unexamined Patent Application Publication No. 2000-100964

SUMMARY

However, in use of the related art measures against the hot carriers described above, as the voltage applied to the MOS transistor becomes larger, the offset length of the LDD (distance from the end of the gate electrode to the high-concentration region) has to be set longer, which might interrupt the miniaturization of the MOS transistor. In particular, in a semiconductor device including a high breakdown voltage MOSFET to which a high voltage of several tens of V is applied, the low-concentration region has a length of about several μm, and hence it is necessary to take new measures against the hot carriers.

Other problems and new features of the present invention will be clearly understood by the following detailed description of the present specification in connection with the accompanying drawings.

The outline of typical means for solving the problems disclosed in the present application will be briefly described as follows.

A semiconductor device according to one embodiment of the invention includes a MISFET with second conductivity type source and drain regions opposed to each other while sandwiching therebetween a first conductivity type well region formed in a semiconductor substrate. At least one of the source region and the drain region includes a second conductivity type low-concentration region, and a second conductivity type high-concentration region having a higher impurity concentration than that of the low-concentration region. The low-concentration region and the well region partially overlap each other.

The effects provided by the typical means for solving the problems disclosed in the present application will be briefly described below.

In the one embodiment of the invention, a region where the low-concentration region and the well region overlap each other can relieve the electric field concentration at the end of the low-concentration region, which can promote the miniaturization of the semiconductor device with the MISFET.

DETAILED DESCRIPTION

Some embodiments of the present invention will be described in detail below based on the accompanying drawings. In all drawings for explaining the embodiments, parts having the same function are indicated by the same reference characters, and the repeated description thereof will be omitted. In the embodiments, the same or similar parts will not be repeatedly described in principle unless absolutely necessary. In some drawings for explaining the embodiments, hatching is applied even to plan views for better understanding of components.

Figure 1:
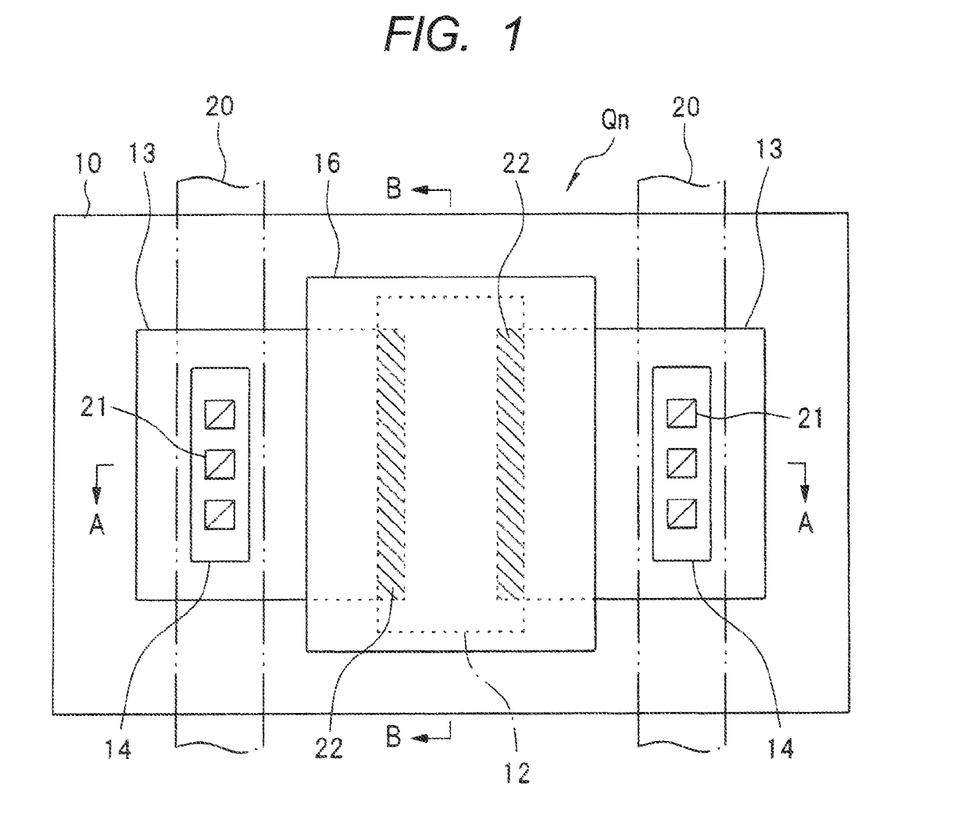
FIG. 1 is a planer layout diagram of a main part of a semiconductor device according to one embodiment of the invention.
Figure 2A:
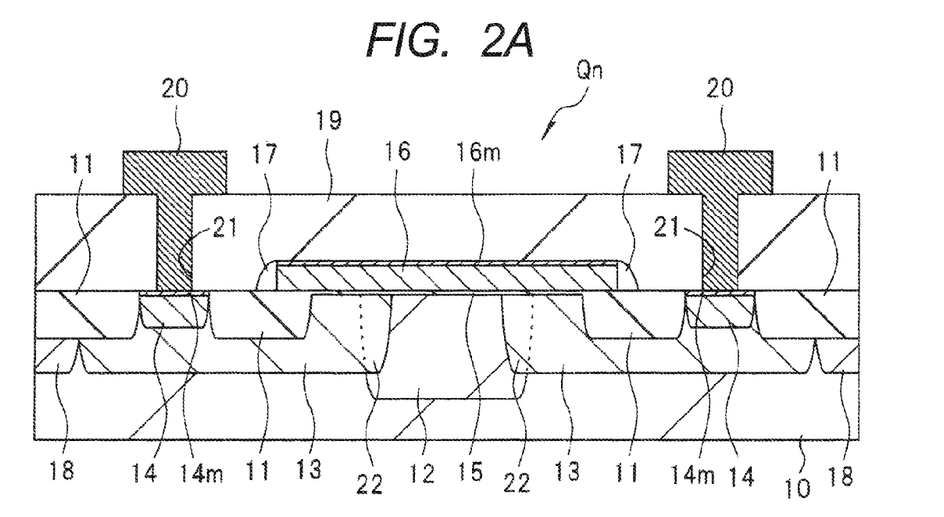
FIG. 2A is a sectional view of a main part taken along the line A-A of FIG. 1.
Figure 2B:
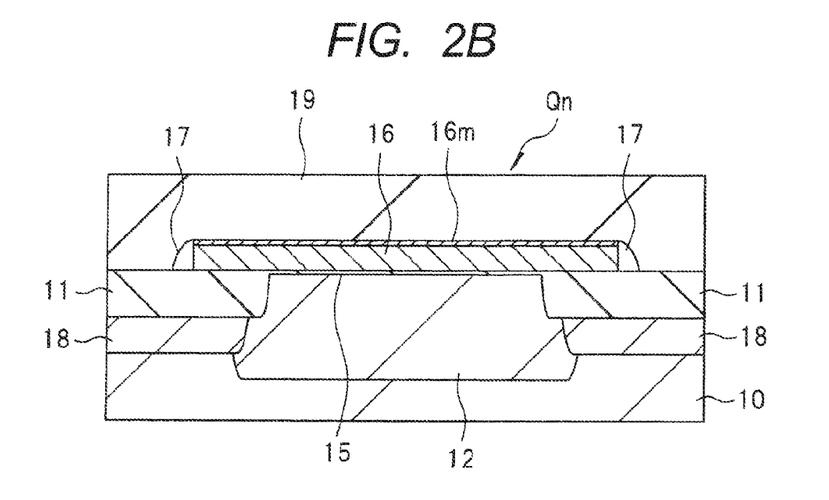
FIG. 2B is a sectional view of a main part taken along the line B-B of FIG. 1.

A semiconductor device in this embodiment will be described below with reference to the drawings. FIG. 1 shows a planer layout diagram of a main part of the semiconductor device in this embodiment. FIGS. 2A and 2B are sectional views of main parts of the semiconductor device taken along the lines A-A and B-B of FIG. 1, respectively. For better understanding, FIG. 1 illustrates only conductive layers (except for a p-type channel stopper region) included in a MISFET, and omits the illustrations of an insulating layer.

An element isolation trench 11 and a p-type well region 12 are formed at a main surface of a semiconductor substrate 10 formed of p-type monocrystalline silicon, for example, having a specific resistance of approximately 1 to 10 Ωcm. An n-channel MISFET (Qn) is formed in an active region of the semiconductor substrate 10 isolated (partitioned) by the element isolation trenches 11. P-type channel stopper regions 18 for preventing inversion are formed at parts of the semiconductor substrate 10 under the element isolation trenches 11, for the purpose of promoting an increase in breakdown voltage of the MISFET (Qn).

The n-channel MISFET (Qn) is the so-called high breakdown voltage MISFET that operates at high voltage of, for example, approximately 30 V to 40 V, and used, for example, as an element or the like configuring a part of a liquid crystal driver circuit. Now, the structure of the MISFET (Qn) will be specifically explained below.

The MISFET (Qn) includes a pair of n-type low-concentration regions 13 and 13 and a pair of n-type high-concentration regions 14 and 14 which are formed on both sides of a p-type well region 12 in the semiconductor substrate 10 with the p-type well region 12 sandwiched between each pair of these regions, a gate oxide film 15 formed at the surface of the active region, and a gate electrode 16 formed from above the element isolation trench 11 across above the gate oxide film 15.

The pair of n-type low-concentration regions 13 and 13 and the pair of n-type high-concentration regions 14 and 14 formed in the semiconductor substrate 10 are semiconductor regions forming a source region and a drain region of the MISFET (Qn). The n-type high-concentration regions 14 and 14 have a higher concentration of impurities (phosphorus or arsenic), and a shallower junction depth than the n-type low-concentration regions 13 and 13. That is, both the source region and drain region of the MISFET (Qn) have the lightly doped drain (LDD) structure. The n-type high-concentration regions 14 and 14 are formed apart from the gate electrode 16 via the element isolation trenches 11 so as to improve the breakdown voltage of the MISFET (Qn).

The gate electrode 16 of the MISFET (Qn) includes a laminated film comprised of an n-type polycrystalline silicon film, for example, doped with phosphorus, and a metal silicide layer 16m formed over the surface of the polycrystalline silicon film. The metal silicide layer 16m is formed of, for example, nickel silicide. Sidewall spacers 17 made of, e.g., a silicon oxide film are formed over sidewalls of the gate electrode 16.

An insulating film 19 made of, e.g., silicon oxide is formed above the MISFET (Qn), and wirings 20 made of, e.g., copper or aluminum, is formed over the insulating film 19. The wirings 20 are electrically coupled to the n-type high-concentration regions 14 and 14 of the MISFET (Qn) through contact holes 21 formed in the insulating film 19. Metal silicide layers 14m are formed over the surfaces of the n-type high-concentration regions 14 and 14 so as to reduce electric resistance to the wirings 20 coupled to the regions 14. The metal silicide layer 14m is formed of, for example, nickel silicide.

The p-type well region 12 formed at the main surface of the semiconductor substrate 10 is sandwiched between the pair of n-type low-concentration regions 13 and 13 of the MISFET (Qn). The vicinity of a surface of the p-type well region 12 serves as a channel region of the MISFET (Qn).

The p-type well region 12 partially overlaps with the respective n-type low-concentration regions 13 and 13, and a depth from the surface of the p-type well region 12 to the bottom thereof is deeper than the junction depth of each of the n-type low-concentration regions 13 and 13. Regions where the p-type well region 12 overlaps with the n-type low-concentration regions 13 and 13 (overlap regions denoted by reference numeral 22) are n-type semiconductor regions having a higher concentration of n-type impurities (phosphorus or arsenic) than that of p-type impurities (boron), and having a substantially higher resistance than that of each of the n-type low-concentration regions 13 and 13.

In this way, the MISFET (Qn) of this embodiment includes the overlap region 22 comprised of the n-type semiconductor region with a higher resistance than the n-type low-concentration region 13, between each of the n-type low-concentration regions 13 and 13 and the channel region (the region in the vicinity of the surface of the p-type well region 12). The electric field concentration at the end of the n-type low-concentration region 13 (at the end of the channel region side) can be relieved by the overlap region 22.

Thus, the occurrence of hot carriers can be suppressed without applying the related art method which involves elongating the offset length of the LDD (distance from the end of the gate electrode 16 to the n-type high-concentration region 14), thereby promoting the miniaturization of the MISFET (Qn) that operates at high voltage.

Figure 3:
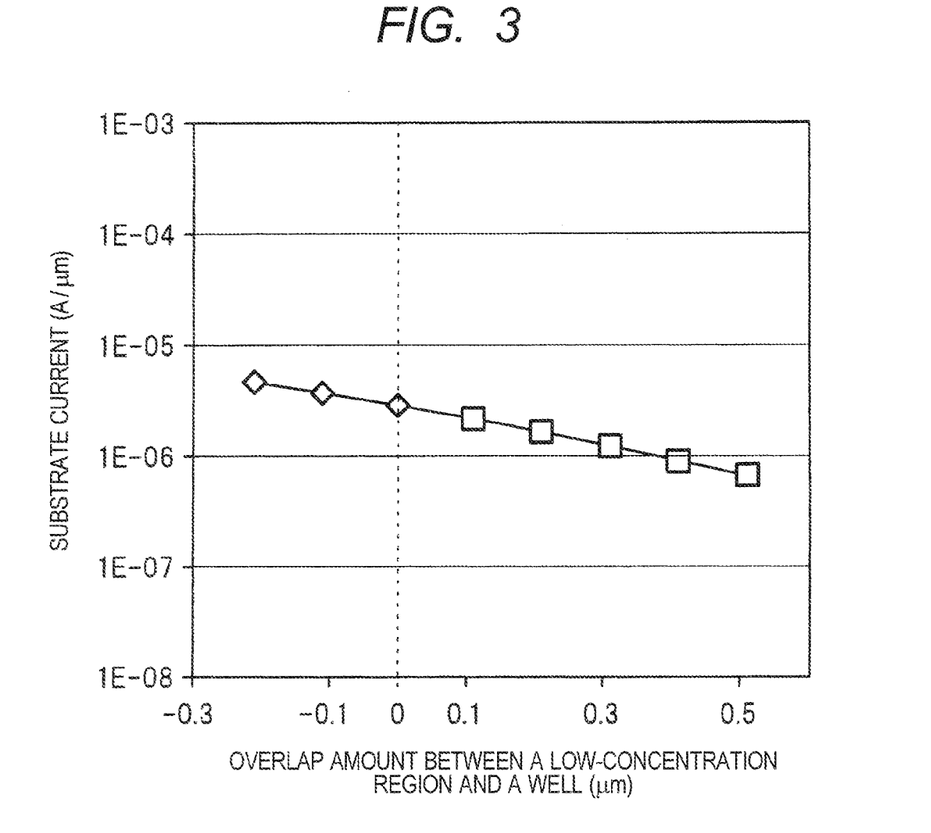
FIG. 3 is a graph obtained by measuring the relationship between an amount of overlap between a p-type well region and an n-type low-concentration region, and a substrate current in a MISFET according to the one embodiment.

FIG. 3 is a graph obtained by measuring the relationship between a length of the overlap region 22 along the gate length direction (direction along the line A-A of FIG. 1) of the MISFET (Qn), that is, an amount of overlap (in units of μm) between the p-type well region 12 and the n-type low-concentration region 13, and a substrate current (in units of A/μm) in a MISFET (Qn) of the one embodiment. Here, the substrate current serves as an index of hot carriers. As the substrate current becomes larger, it means that the amount of hot carriers due to the electric field concentration at the end of the drain region is increased.

As can be seen from FIG. 3, as the amount of overlap (in units of μm) between the p-type well region 12 and the n-type low-concentration region 13 is increased, the substrate current is decreased. Therefore, this shows that the electric field concentration at the end of the n-type low-concentration region 13 (end on the channel region side) is relieved by the overlap region 22.

The amount of overlap between the p-type well region 12 and the n-type low-concentration region 13 is desirably at least 0.1 μm or more, taking into consideration misalignment of an ion implantation mask in formation of the p-type well region 12, or an ion implantation mask in formation of the n-type low-concentration region 13. The substrate current due to the hot carriers is decreased with increasing overlap amount. However, as the overlap amount is increased, a parasitic resistance of the n-type low-concentration region 13 is increased to reduce the characteristics of the MISFET (Qn). Therefore, it is desirable that even the maximum overlap amount is set to a level that brings the end of the p-type well region 12 into contact with the end of the element isolation region 11 (end of the gate oxide film 15) shown in FIG. 2 (in MISFET (Qn) of this embodiment, the overlap amount at this time is set to about 1 μm.)

Next, a manufacturing method of the above-mentioned n-channel MISFFET (Qn) will be described with reference to FIGS. 4 to 20. For better understanding of the figures, the plan views for explaining the manufacturing method only illustrate conductive layers included in the MISFET (Qn) (except for the p-type channel stopper region 18), and will omit the illustration of any insulating layer.

Figure 4:
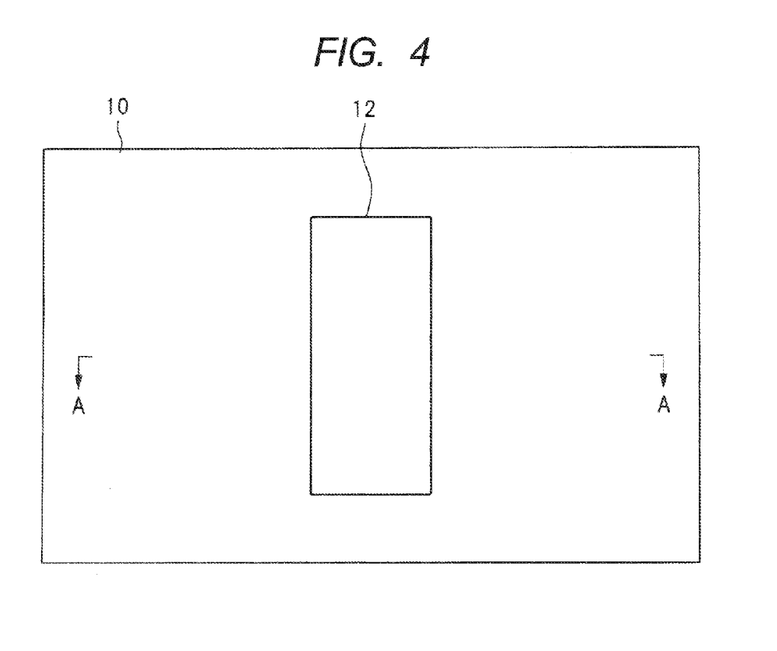
FIG. 4 is a planer layout diagram of a main part of one step in a manufacturing procedure of the semiconductor device according to the one embodiment.
Figure 5:
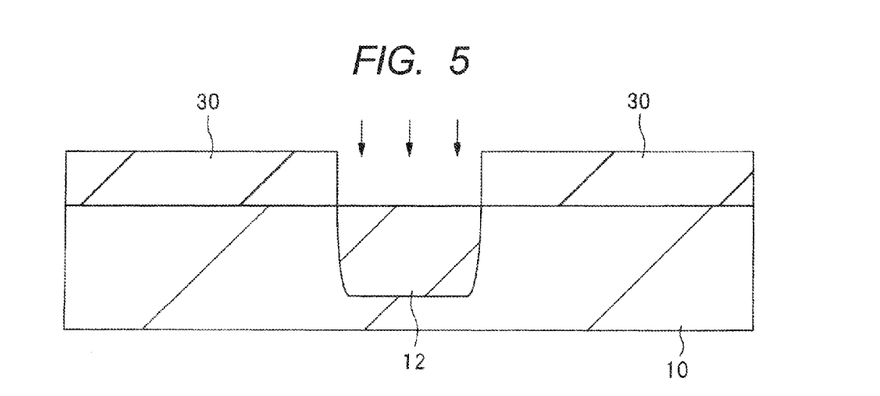
FIG. 5 is a sectional view of a main part taken along the line A-A of FIG. 4.

First, as shown in FIGS. 4 and 5 (which is a sectional view taken along the line A-A of FIG. 4), impurities (boron) are ion-implanted into the semiconductor substrate 10 using the photoresist film 30 as a mask to thereby form the p-type well region 12. At this time, a region for the p-type well region 12 is formed to overlap with parts of the respective n-type low-concentration regions 13 and 13, which are to be formed in the semiconductor substrate 10 on both sides of the p-type well region 12 in a next step.

When forming the p-type well region 12, a dose amount of the impurities in the vicinity of the surface of the p-type well region 12 is set more than that in a deep area of the p-type well region 12, whereby the channel region (not shown) is formed in the vicinity of the surface of the p-type well region 12. In this way, the p-type well region 12 and the channel region can be formed in the same step.

Figure 6:
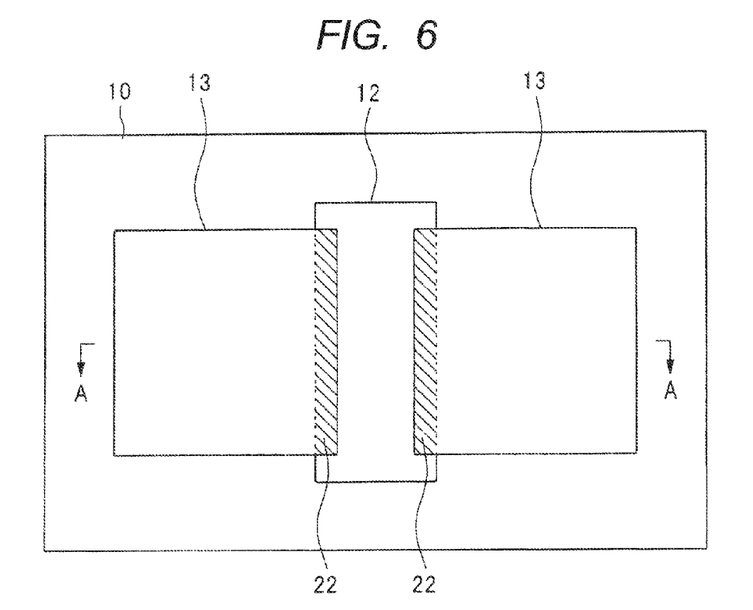
FIG. 6 is a planer layout diagram of a main part of another step in the manufacturing procedure of the semiconductor device, following the step shown in FIGS. 4 and 5.
Figure 7:
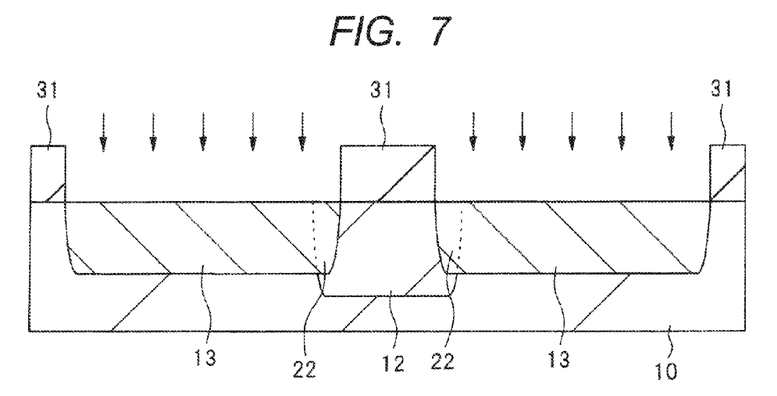
FIG. 7 is a sectional view of a main part taken along the line A-A of FIG. 6.

After removing the photoresist film 30 by ashing or wet etching, as shown in FIGS. 6 and 7 (which is a sectional view taken along the line A-A of FIG. 6), impurities (phosphorus or arsenic) are ion-implanted into the semiconductor substrate 10 using a photoresist film 31 as a mask, thereby forming the n-type low-concentration regions 13 in the semiconductor substrate 10 on both sides of the p-type well region 12. Thus, the overlap regions 22 are formed in regions where the p-type well region 12 overlaps with the n-type low-concentration regions 13.

When forming the p-type well region 12 and the n-type low-concentration region 13, the concentration of these impurities (dose amount of the impurities) is adjusted such that the overlap region 22 becomes an n-type semiconductor region having a higher resistance than the n-type low-concentration region 13.

The depth from the surface of the p-type well region 12 to the bottom thereof is set deeper than that from the surface of the n-type low-concentration region 13 to the bottom thereof. Thus, the end of each n-type low-concentration region 13 (the end thereof on a side of the p-type well region 12) has its entire area (from the surface to bottom thereof) coming into contact with the overlap region 22, so that the electric field concentration can be relieved across the entire end of the n-type low-concentration regions 13.

Note that the order of formation of the p-type well region 12 and the n-type low-concentration region 13 is arbitrary. After forming the n-type low-concentration regions 13, the p-type well region 12 may be formed.

Figure 8:
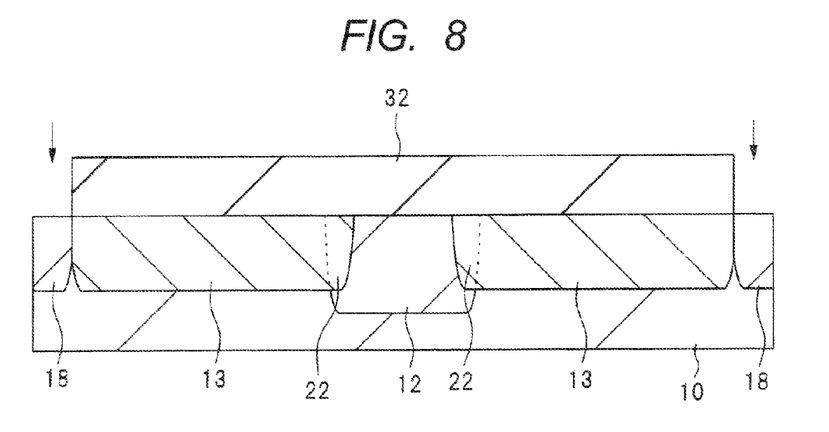
FIG. 8 is a sectional view of a main part of another step in the manufacturing procedure of the semiconductor device, following the step shown in FIGS. 6 and 7.

After removing the photoresist film 31 by ashing or wet etching, as shown in FIG. 8, impurities (phosphorus) are ion-implanted into the semiconductor substrate 10 using a photoresist film 32 as a mask, thereby forming the p-type channel stopper region 18.

Figure 9:
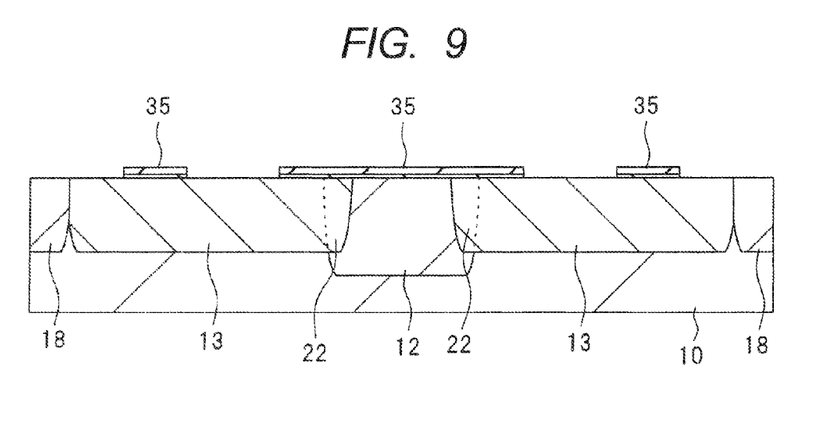
FIG. 9 is a sectional view of a main part of another step in the manufacturing procedure of the semiconductor device, following the step shown in FIG. 8.

Then, after removing the photoresist film 32 by ashing or wet etching, as shown in FIG. 9, a hard mask 35 is formed to cover the active region of the semiconductor substrate 10. The hard mask 35 is formed, for example, by forming a silicon oxide film over a main surface of the semiconductor substrate 10 by a thermal oxidation method or CVD method, subsequently laminating a silicon nitride film over the silicon oxide film by the CVD method, and then patterning these laminated films by dry etching using a photoresist film as a mask.

Figure 10:
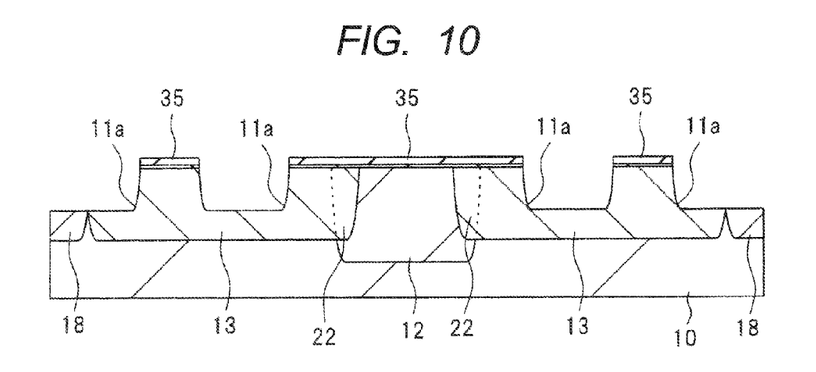
FIG. 10 is a sectional view of a main part of another step in the manufacturing procedure of the semiconductor device, following the step shown in FIG. 9.
Figure 11:
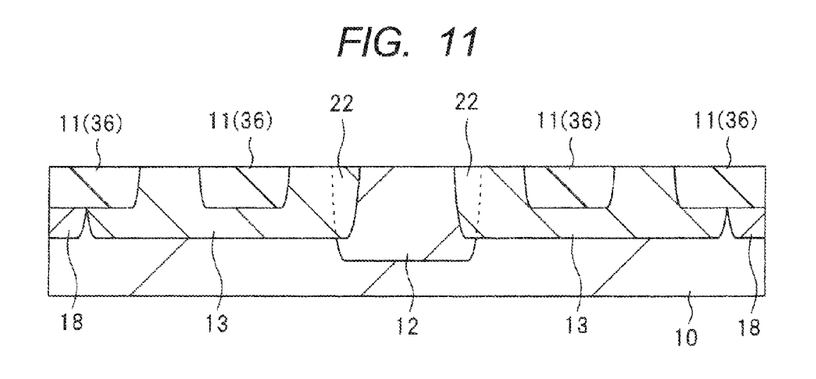
FIG. 11 is a sectional view of a main part of another step in the manufacturing procedure of the semiconductor device, following the step shown in FIG. 10.

Then, as shown in FIG. 10, the semiconductor substrate 10 is dry etched using the hard mask 35 as a mask to thereby form trenches 11a in the semiconductor substrate 10 within the element isolation regions. Subsequently, as shown in FIG. 11, after depositing a silicon oxide film 36 over the main surface of the semiconductor substrate 10 by the CVD method, the silicon oxide film 36 is planarized by a CMP (chemical mechanical polishing) method to remain within the trenches 11a. Then, the hard mask 35 covering the active region of the semiconductor substrate 10 is removed by the wet etching. In this way, the element isolation trenches 11 with the silicon oxide film 36 embedded therein are formed in the semiconductor substrate 10 within the element isolation regions, and the p-type channel stopper regions 18 formed in the previous step are positioned under the element isolation trenches 11.

Here, the element isolation trench 11 is formed by embedding the silicon oxide film 36 in each trench 11a formed in the semiconductor substrate 10 within the element isolation region. Alternatively, a field oxide film may be formed in the element isolation regions by the so-called LOCOS (local oxidation of silicon) method which involves applying a heat treatment to the silicon oxide film formed on the surface of the semiconductor substrate 10 within the element isolation region to increase its thickness.

Figure 12:
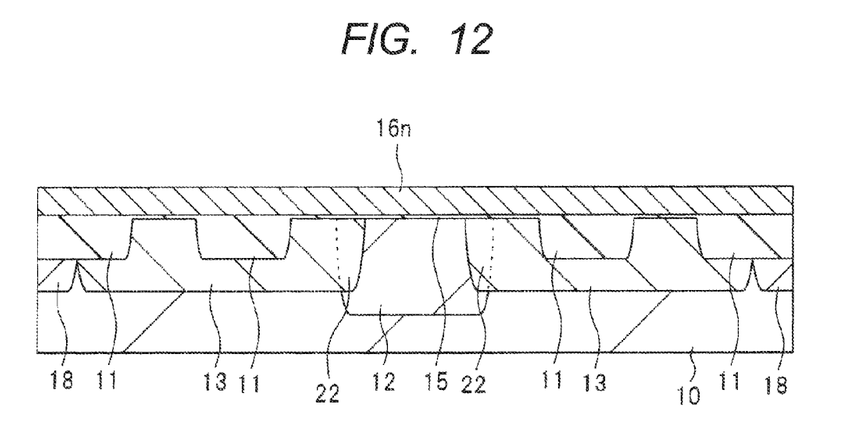
FIG. 12 is a sectional view of a main part of another step in the manufacturing procedure of the semiconductor device, following the step shown in FIG. 11.

Then, as shown in FIG. 12, the semiconductor substrate 10 is subjected to a heat treatment to form the gate oxide film 15 including silicon oxide, over the surface of the active region, and thereafter, a polycrystalline silicon film 16n is deposited over the main surface of the semiconductor substrate 10 by the CVD method. The polycrystalline silicon film 16n has an n-type conductivity by doping phosphorus thereinto during the deposition. The gate oxide film 15 can also be formed by pattering a part of the silicon oxide film deposited by the CVD method, by dry etching to partially leave the silicon oxide film on the surface of the active region.

Figure 13:
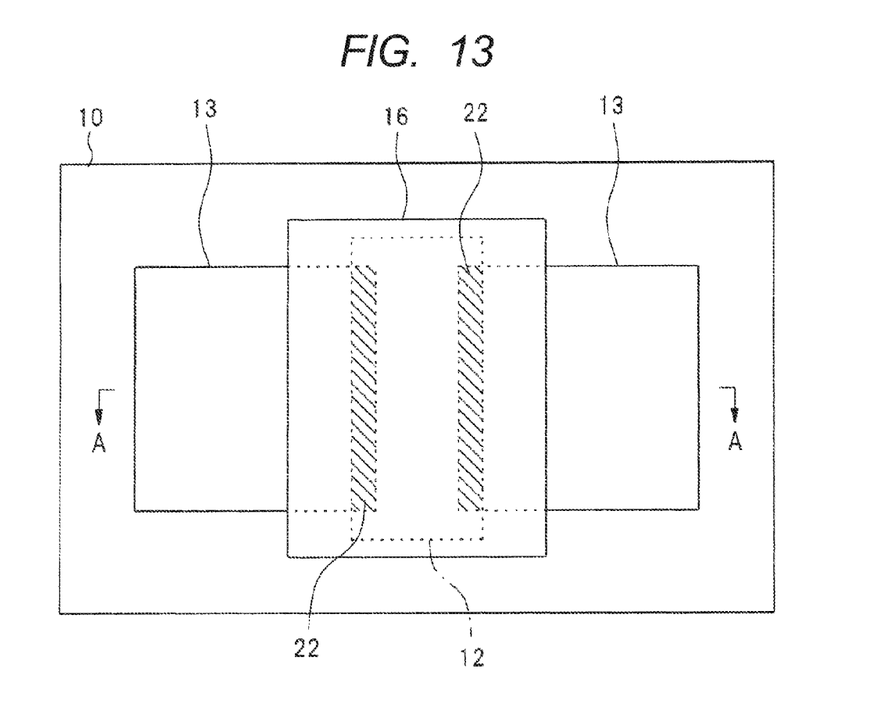
FIG. 13 is a planer layout diagram of a main part of another step in a manufacturing procedure of the semiconductor device, following the step shown in FIG. 12.
Figure 14:
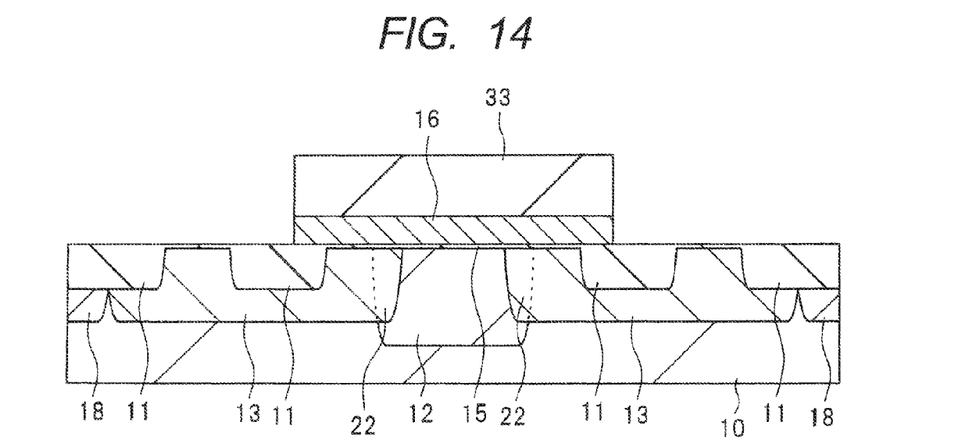
FIG. 14 is a sectional view of a main part taken along the line A-A of FIG. 13.

Then, as shown in FIGS. 13 and 14 (which is a sectional view taken along the line A-A of FIG. 13), the polycrystalline silicon film 16n is dry etched using a photoresist film 33 as a mask to thereby form the gate electrode 16 above the gate oxide film 15. The gate electrode 16 is formed to have both ends thereof in a gate width direction partially covering the element isolation trenches 11.

Figure 15:
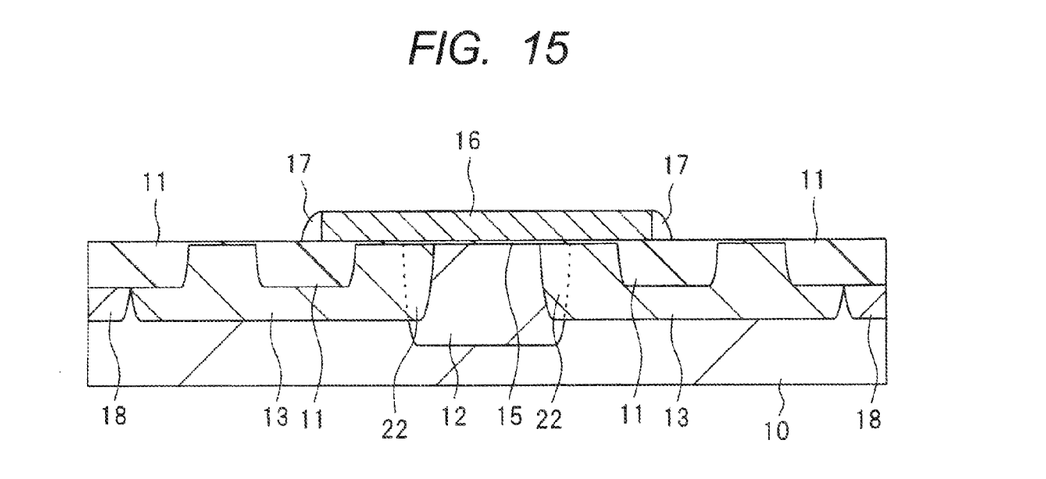
FIG. 15 is a sectional view of a main part of another step in the manufacturing procedure of the semiconductor device, following the step shown in FIGS. 13 and 14.

After removing the photoresist film 33, as shown in FIG. 15, the sidewall spacers 17 are formed on sidewalls of the gate electrode 16. The sidewall spacer 17 is formed, for example, by depositing a silicon oxide film over the main surface of the semiconductor substrate 10 by the CVD method, and subsequently anisotropically etching the silicon oxide film.

Figure 16:
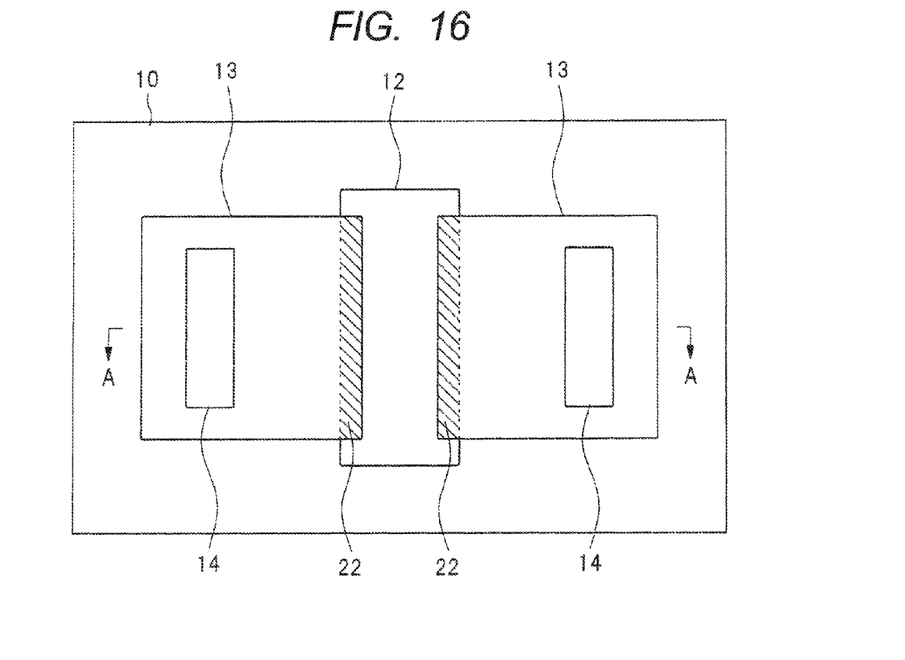
FIG. 16 is a planer layout diagram of a main part of another step in the manufacturing procedure of the semiconductor device, following the step shown in FIG. 15.
Figure 17:
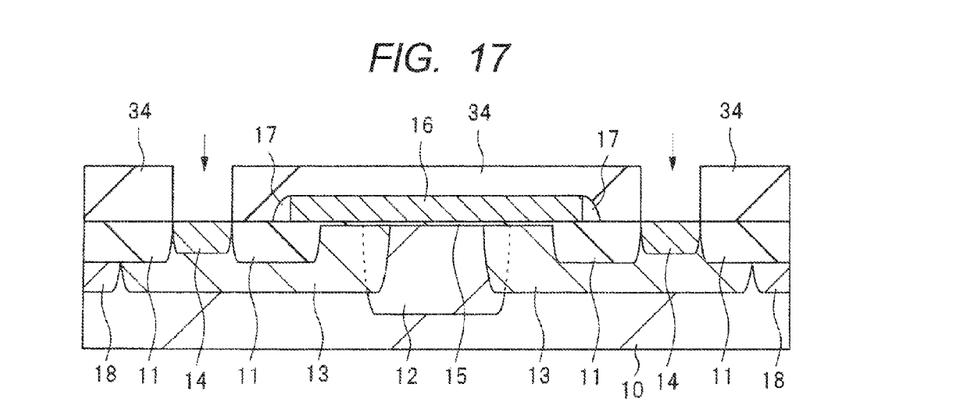
FIG. 17 is a sectional view of a main part taken along the line A-A of FIG. 16.

Then, as shown in FIGS. 16 and 17 (which is a sectional view taken along the line A-A of FIG. 16), impurities (phosphorus or arsenic) are ion-implanted into parts of the n-type low-concentration regions 13 using a photoresist film 34 as a mask to thereby form the n-type high-concentration regions 14. Thus, the source region and drain region each having the LDD structure comprised of the n-type low-concentration region 13 and the n-type high-concentration region 14 are formed on both sides of the gate electrode 16.

Figure 18:
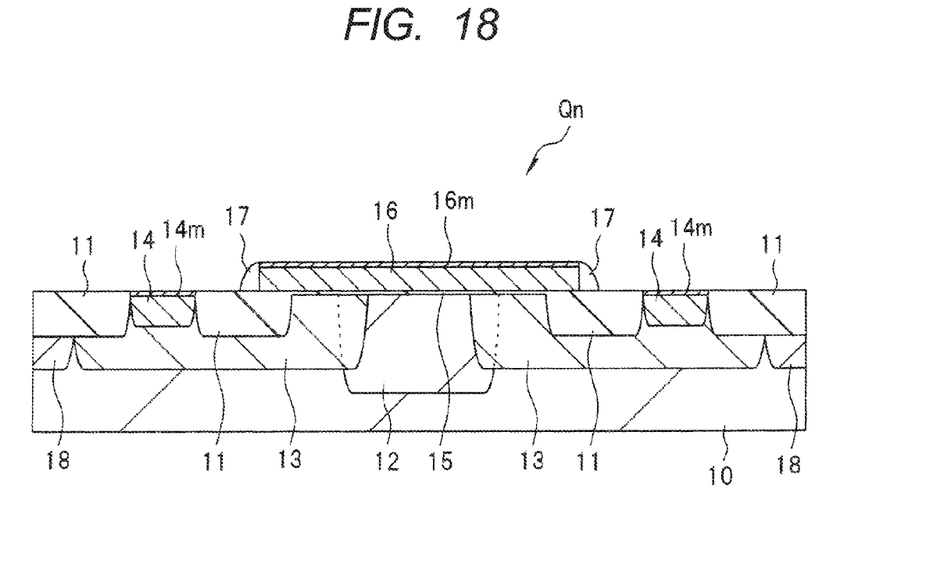
FIG. 18 is a sectional view of a main part of another step in the manufacturing procedure of the semiconductor device, following the step shown in FIGS. 16 and 17.

After removing the photoresist film 34, as shown in FIG. 18, the metal silicide layer 14m is formed over the surface of the n-type high-concentration region 14, and the metal silicide layer 16m is formed over the surface of the gate electrode 16. The formation of the metal silicide layers 14m and 16m involves, for example, depositing a nickel film over the main surface of the semiconductor substrate 10 by sputtering, subsequently applying a heat treatment to the semiconductor substrate 10 to cause reactions between the polycrystalline silicon film forming the gate electrode 16 and the nickel film, and between the monocrystalline silicon layer forming the n-type high-concentration region 14 and the nickel film, and then removing unnecessary parts of the nickel film by wet etching. Note that a metal film used for formation of the metal silicide layers 14m and 16m may be a cobalt film, a titanium film, etc.

Figure 19:
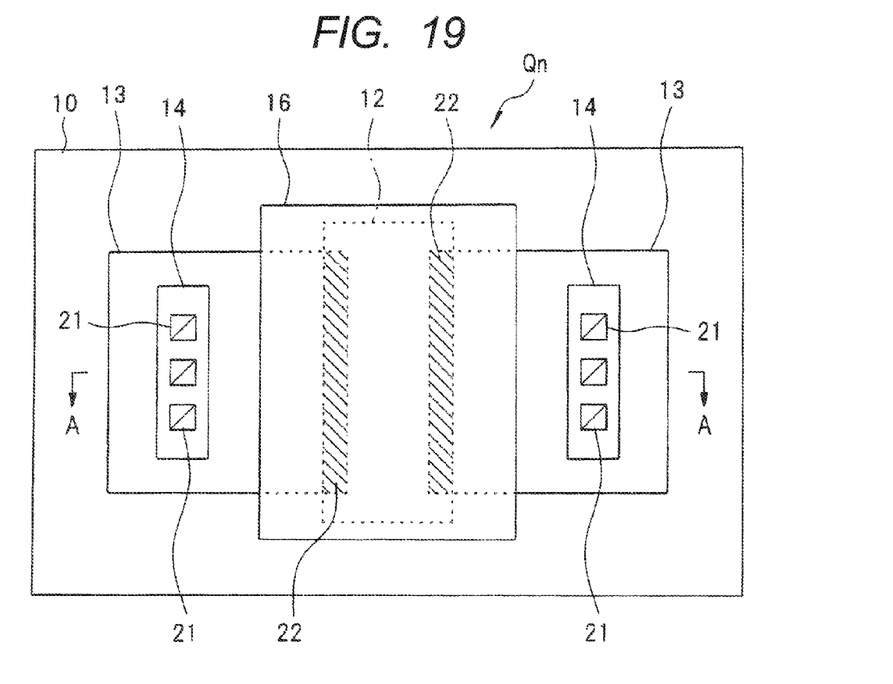
FIG. 19 is a planer layout diagram of a main part of another step in the manufacturing procedure of the semiconductor device, following the step shown in FIG. 18.
Figure 20:
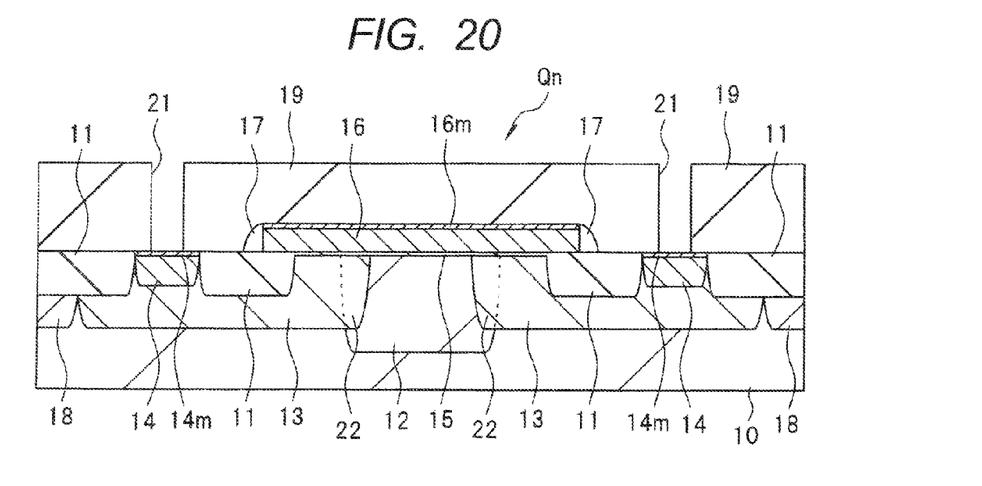
FIG. 20 is a sectional view of a main part taken along the line A-A of FIG. 19.

Then, as shown in FIGS. 19 and 20 (which is a sectional view taken along the line A-A of FIG. 19), the insulating film 19 is formed of a silicon oxide film etc., over the main surface of the semiconductor substrate 10 by the CVD method, and then the insulating film 19 is dry etched by using a photoresist film (not shown) as a mask, thereby making the contact holes 21 in the insulating film 19 above the n-type high-concentration regions 14.

Thereafter, a wiring 20 is formed of copper, aluminum, or the like over parts of the insulating film 19 and within the contact holes 21, whereby the MISFET (Qn) shown in FIGS. 1 and 2 is completed.

According to the manufacturing method of this embodiment described above, the overlap region 22 is formed by disposing the p-type well region 12 in a region sandwiched between the pair of the n-type low-concentration regions 13 and 13. Thus, the overlap region 22 can be formed, for example, in the steps the number of which is the same as that in a related art manufacturing method for forming a p-type well region in an entire area that forms an n-channel MISFET (Qn).

Although the invention made by the inventors have been specifically described based on the embodiments, the invention is not limited to the embodiments, and various modifications and changes can be made to those embodiments without departing from the scope of the invention.

Although the above-mentioned embodiments have explained the examples of application to the MISFET that operates at a high voltage of about 30 V to 40 V, the invention is not limited thereto. Specifically, the invention can be suitably used for any MISFET that operates at high voltage, particularly, of about 20 V to 80 V.

Although the above-mentioned embodiments have explained the examples of application to the MISFET that includes the n-type low-concentration region formed in each of the source region and the drain region, the invention can also be applied to a MISFET having an asymmetric structure that includes a low-concentration region formed only in one of the source and drain regions.

Further, the above-mentioned embodiments have explained the examples of application to the semiconductor device including the n-channel MISFET. Alternatively, the invention can also be applied to a semiconductor device including a p-channel MISFET formed in an n-type semiconductor substrate or n-type well region.

What is claimed is:
1. A semiconductor device, comprising:
a semiconductor substrate;
a first conductivity type well region formed in the semiconductor substrate;
a gate insulating film formed over a surface of the well region;
a gate electrode formed above the gate insulating film; and
second conductivity type source and drain regions formed in the semiconductor substrate and opposed to each other with the well region sandwiched between the regions,
wherein at least one of the source region and the drain region includes a second conductivity type low-concentration region, and a second conductivity type high-concentration region having a higher impurity concentration than that of the low-concentration region, and
wherein the low-concentration region partially overlaps with the well region and is partially formed in a portion of the semiconductor substrate in which the first conductivity type well region is not formed.
2. The semiconductor device according to claim 1, wherein a depth from the surface of the well region to a bottom thereof is deeper than that of a surface of the low-concentration region to a bottom thereof.
3. The semiconductor device according to claim 1, wherein an amount of overlap between the low-concentration region and the well region along a gate length direction of the gate electrode is 0.1 µm or more.
4. The semiconductor device according to claim 1, wherein an end of the well region is in contact with an end of an element isolation region formed in the semiconductor substrate.

* * * * *